United States Patent [19]

Chonan

[11] Patent Number: 5,461,585
[45] Date of Patent: Oct. 24, 1995

[54] SEMICONDUCTOR INTEGRATED CIRCUIT HAVING DELAY CIRCUIT WITH VOLTAGE-TO-DELAY CHARACTERISTICS PROPORTIONAL TO POWER VOLTAGE LEVEL

[75] Inventor: Toru Chonan, Tokyo, Japan

[73] Assignee: NEC Corporation, Tokyo, Japan

[21] Appl. No.: 157,296

[22] Filed: Nov. 26, 1993

[30] Foreign Application Priority Data

Nov. 27, 1992 [JP] Japan .................... 4-341418

[51] Int. Cl.$^6$ .................................. G11C 7/06
[52] U.S. Cl. .............. 365/194; 365/189.09; 365/226;
327/264; 327/534; 327/537
[58] Field of Search ................. 307/296.2, 296.6,
307/296.8; 365/226, 189.09, 189.05, 194;
327/262, 264, 288, 534, 537, 543

[56] References Cited

U.S. PATENT DOCUMENTS

| | | | |
|---|---|---|---|
| 4,439,692 | 3/1984 | Beekmans et al. | 307/297 |
| 4,802,127 | 1/1989 | Akaogi | 365/194 X |
| 5,164,621 | 11/1992 | Miyamoto | 307/296.8 X |
| 5,200,921 | 4/1993 | Okajima | 365/226 X |
| 5,262,999 | 11/1993 | Etoh et al. | 365/226 |
| 5,315,166 | 5/1994 | Arimoto | 307/296.2 |

FOREIGN PATENT DOCUMENTS

| | | |
|---|---|---|
| 0029681 | 6/1981 | European Pat. Off. . |
| 0032588 | 7/1981 | European Pat. Off. . |
| 2-189792 | 7/1990 | Japan ................ 365/194 |

Primary Examiner—David C. Nelms
Assistant Examiner—Son Mai
Attorney, Agent, or Firm—Sughrue, Mion, Zinn, Macpeak & Seas

[57] ABSTRACT

A semiconductor memory device has an addressable data storage powered with an internal step-down power voltage for storing data bits, a signal buffer circuit powered with a non-step-down power voltage for producing an internal output enable signal, an output data buffer circuit powered with the non-step-down power voltage and enabled with the internal output enable signal for producing an output data signal from a read-out data bit and a delay circuit connected between the signal buffer circuit and the output data buffer circuit for introducing delay into propagation of the internal output enable signal, and the delay circuit is implemented by a plurality of complementary inverters connected in cascade, wherein the p-channel enhancement type field effect transistors of the complementary inverters have source nodes connected with an internal step-down power voltage line and channel regions biased with the non-step-down power voltage so that the delay is proportional to the external power voltage.

7 Claims, 9 Drawing Sheets

SEMICONDUCTOR INTEGRATED CIRCUIT HAVING DELAY CIRCUIT WITH VOLTAGE-TO-DELAY CHARACTERISTICS PROPORTIONAL TO POWER VOLTAGE LEVEL

FIELD OF THE INVENTION

This invention relates to a semiconductor integrated circuit device and, more particularly, to a delay circuit incorporated in the semiconductor integrated circuit.

DESCRIPTION OF THE RELATED ART

Figure 1:
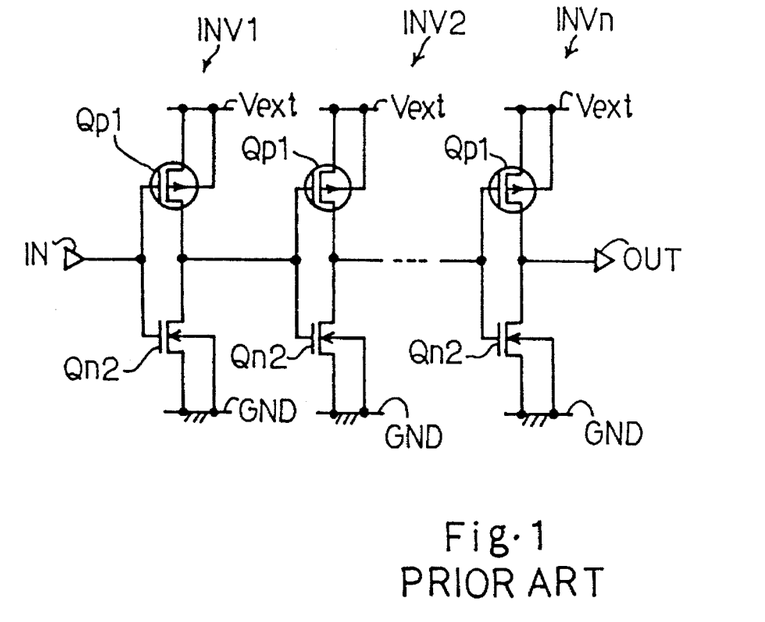
FIG. 1 is a circuit diagram showing the arrangement of the first prior art delay circuit.

A digital integrated circuit device produces internal signals from external signals, and achieves a given task with the internal signals. The internal signals are used for producing an output signal, and an internal signal processing usually requires a timing control. A delay circuit is available for the timing control, and a typical example of the delay circuit is illustrated in FIG. 1 of the drawings.

The prior art delay circuit is fabricated on a p-type semiconductor substrate (not shown), and comprises a plurality of complementary inverters INV1, INV2, . . . and INVn coupled in cascade between an input node IN and an output node OUT. Each of the complementary inverters INV1 to INVn is implemented by a series combination of a p-channel enhancement type field effect transistor Qp1 and an n-channel enhancement type field effect transistor Qn2.

The input node IN is connected with the gate electrode of the p-channel enhancement type field effect transistor Qp1 and with the gate electrode of the n-channel enhancement type field effect transistor Qn2 of the complementary inverter serving as the first stage of the delay circuit, and the common drain node of the enhancement type field effect transistors Qp1 and Qn2 is coupled with the gate electrodes of the enhancement type field effect transistors Qp1 and Qn2 of the next stage. The common drain node of the final stage is connected with the output node OUT.

The p-channel enhancement type field effect transistors Qp1 are formed in n-type wells formed in surface portions of the semiconductor substrate, and the n-channel enhancement type field effect transistors Qn2 are formed in other surface portions of the p-type semiconductor substrate. The p-type semiconductor substrate is biased with the ground voltage level GND, and the source nodes of the n-channel enhancement type field effect transistors Qn2 are connected with a ground voltage line.

On the other hand, the n-type wells are biased with an external power voltage level Vext, and the source nodes of the p-channel enhancement type field effect transistors Qp1 are connected with a power voltage line for the external power voltage Vext.

The prior art delay circuit thus arranged behaves as follows. While the input node IN is in the external power voltage level Vext, the n-channel enhancement type field effect transistor Qn2 of the first stage is turned on for conducting the common drain node to the ground voltage line, and the p-channel enhancement type field effect transistor Qp1 of the first stage is turned off for isolating the common drain node from the power voltage line. Therefore, the common drain node of the first stage is applied with the ground voltage level, and the complementary inverter INV1 inverts the voltage level between the input node IN and the common drain node thereof. The voltage level is further inverted between the common drain node of the first stage and the common drain node of the second stage, and, accordingly, the voltage level at the input node IN is sequentially propagated through the complementary inverters INV1 to INVn to the output node OUT.

Time delay is introduced in the switching action of each stage, and the total amount of delay is proportional to the number of stages or the complementary inverters INV1 to INVn.

Figure 2:
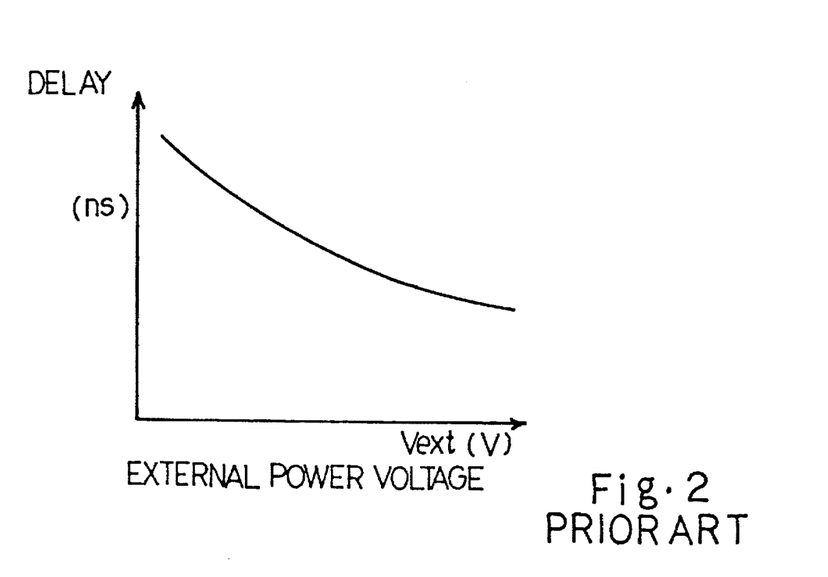
FIG. 2 is a graph showing the voltage dependency of the delay time introduced by each stage of the first prior art delay circuit.

The switching speed of the complementary inverter is proportional to the external power voltage level Vext, and the delay introduced by each stage is inversely proportional to the external power voltage level Vext as shown in FIG. 2. This is because of the fact that the p-channel enhancement type field effect transistor Qp and the n-channel enhancement type field effect transistor Qn increase respective current driving capabilities together with the external power voltage level Vext.

Figure 3:
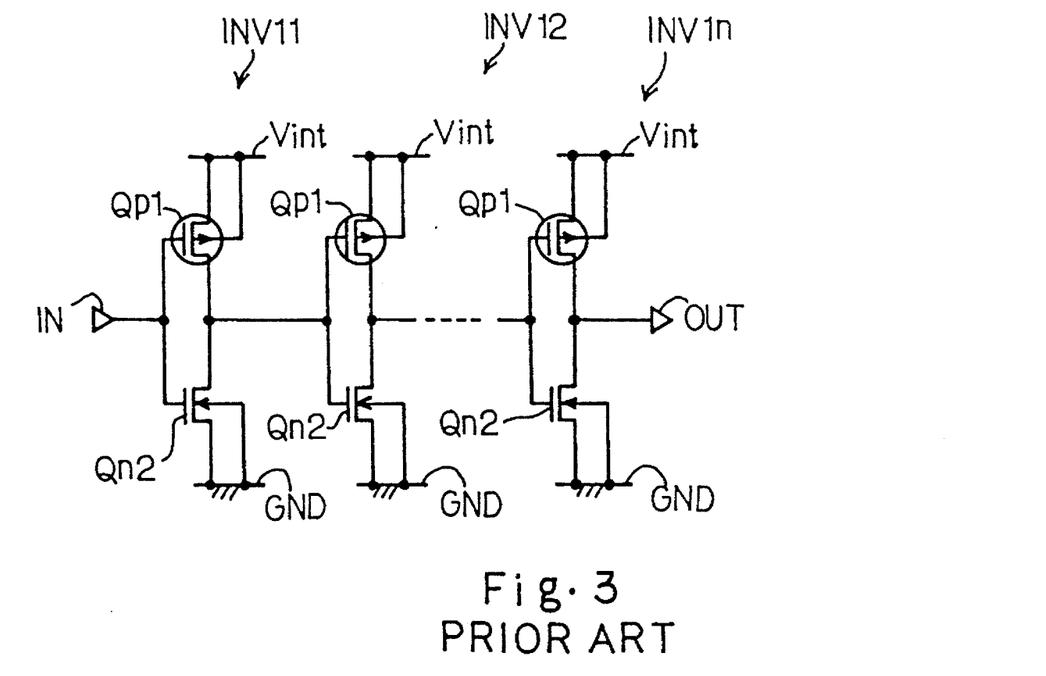
FIG. 3 is a circuit diagram showing the arrangement of the second prior art delay circuit.

Turning to FIG. 3 of the drawings, another prior art delay circuit is implemented by complementary inverters INV11, INV12, . . . and INV1n coupled in cascade. The circuit arrangement of the second prior art is similar to that of the first prior art except for a bias voltage to p-channel enhancement type field effect transistors Qp1, and voltage lines and component transistors are labeled with the same references as those of the first prior art. Namely, an internal power voltage Vint biases the source nodes of the p-channel enhancement type field effect transistors Qp1 and the n-wells where the p-channel enhancement type field effect transistors Qp1 are formed.

Figure 4:
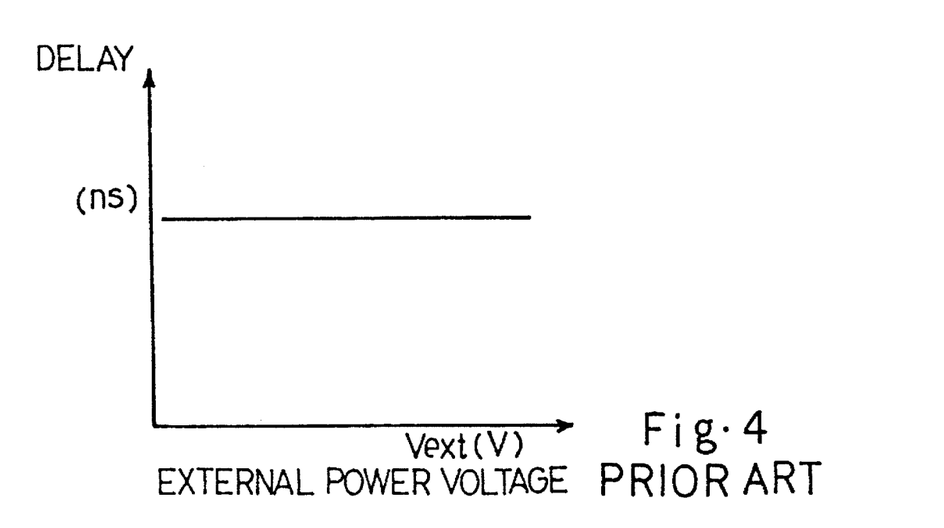
FIG. 4 is a graph showing the voltage dependency of the delay time introduced by each stage of the second prior art delay circuit.

The internal power voltage Vint is produced from the external power voltage Vext by means of a step-down voltage generator (not shown), and the internal power voltage level Vint is less affectable by fluctuation of the external power voltage level Vext, because the step-down voltage generator takes up the fluctuation. Therefore, the delay introduced by each stage is constant with respect to the external power voltage Vext as shown in FIG. 4.

Figure 5:
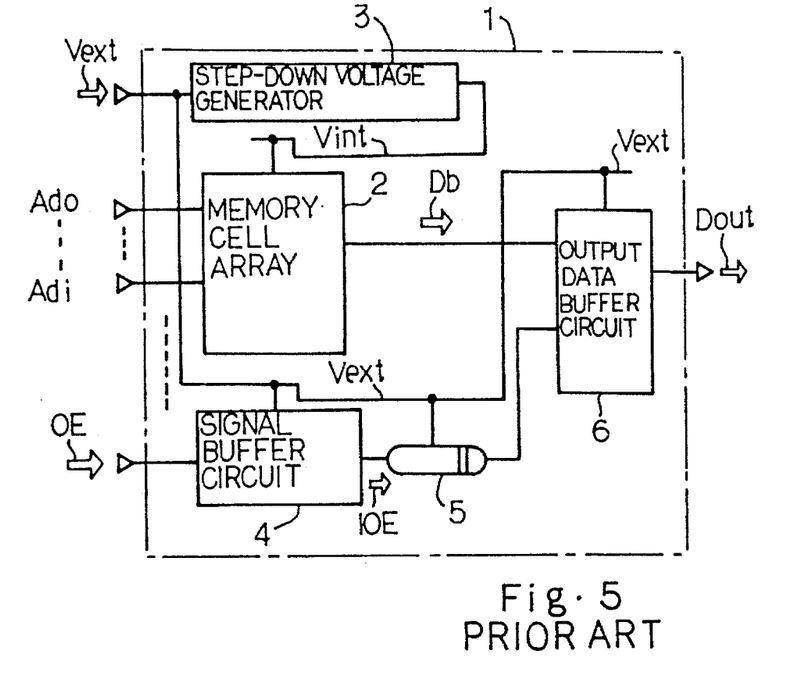
FIG. 5 is a block diagram showing the prior art semiconductor memory device equipped with the prior art delay circuit.

FIG. 5 illustrates a prior art semiconductor memory device including the first prior art delay circuit, and the prior art semiconductor memory device is fabricated on a semiconductor substrate 1. The prior art semiconductor memory device comprises a memory cell array 2 for storing data bits and a step-down voltage generator 3 for producing an internal power voltage Vint from an external power voltage Vext, and the internal power voltage Vint is supplied to the memory cell array 2. The memory cell array 2 is powered with the internal power voltage Vint, and is responsive to external address bits Ad0 to Adi for a data access.

The prior art semiconductor memory device further comprises a signal buffer circuit 4 for storing an external control signal OE, a delay circuit 5 for introducing delay into propagation of an internal control signal IOE, and an output data buffer circuit 6 for storing a read-out data Db. The signal buffer circuit 4, the delay circuit 5 and the output data buffer circuit 6 are powered with the external power voltage, and the output data buffer circuit 6 is responsive to the internal control signal IOE for outputting the read-out data Db.

As described hereinbefore, the internal power voltage Vint is substantially constant regardless of fluctuation of the external power voltage Vext. For this reason, the memory cell array 2 powered with the internal power voltage Vint supplies the read-out data Db after a predetermined delay from an address transition, and the predetermined delay is constant regardless of the fluctuation of the external power voltage Vext as indicated by Plots A in FIG. 6.

On the other hand, the signal buffer circuit 4, the delay circuit 5 and the output data buffer circuit 6 are powered with the external power voltage Vext, and the switching actions thereof are affected by the fluctuation of the external power voltage Vext. Therefore, the total amount of delay between the change of the external control signal OE and the arrival of the internal control signal IOE at the output data buffer circuit 6 is variable with the external power voltage Vext as indicated by a dash-and-dot line D1 in FIG. 6.

Figure 6:
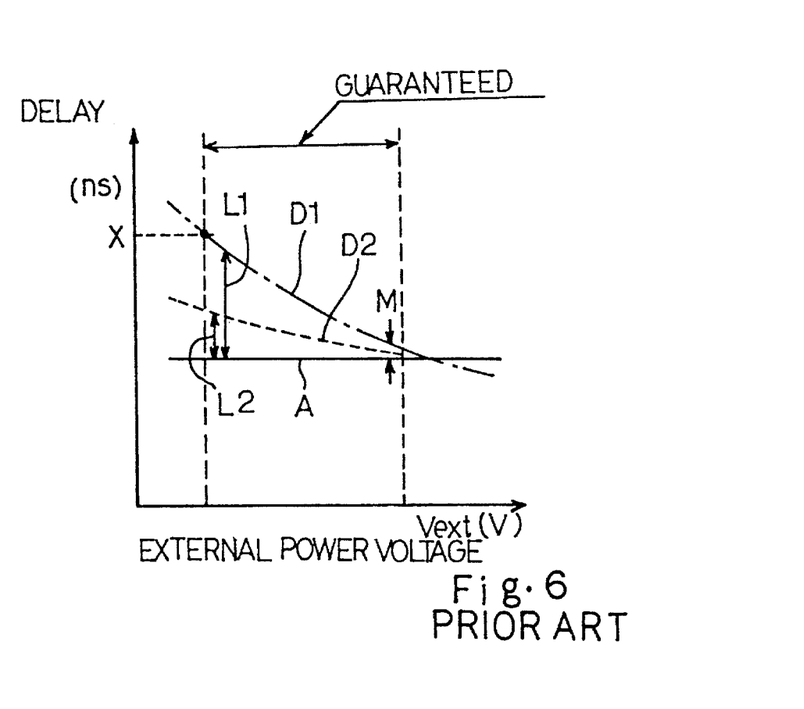
FIG. 6 is a graph showing the delay of the read-out data and the delay of the internal control signal in terms of the external power voltage.

If the output data buffer circuit 6 is enabled with the internal control signal IOE before the arrival of the read-out data bit Db, the output data signal Dout does not represent the read-out data Db. Thus, for proper operation it is necessary for the internal control signal IOE to arrive at the output data buffer circuit 6 later than the read-out data bit. This means that the circuit designer sets a margin M at the highest level of the guaranteed range. If the margin M is set at the highest level, the delay introduced in the propagation of the internal control signal IOE is too much to appropriately output the read-out data Db at a lower external power voltage level Vext due to the difference L1 from the delay of the read-out data bit. Therefore, the manufacturer only guarantees the access time X for the semiconductor memory device.

If the delay circuit 5 is changed to the second prior art shown in FIG. 3, the delay introduced by the delay circuit 5 is substantially constant over the guaranteed range. However, the switching speed of the signal buffer circuit 4 is still affected by the fluctuation of the external power voltage Vext, and the total delay is indicated by Plots D2. Although the gradient of Plots D2 is smaller than that of Plots D1, the margin M is set at the highest external power voltage Vext, and difference L2 still takes place at a lower external power voltage Vext.

Thus, the prior art delay circuit does not adequately control the data output timing constant, and the guaranteed access time is undesirably prolonged.

SUMMARY OF THE INVENTION

It is therefore an important object of the present invention to provide a semiconductor integrated circuit having a delay circuit with voltage-to-delay characteristics proportional to a power voltage level such that access time for a memory device is improved.

To accomplish the object, the present invention proposes to control switching speed of a complementary inverter forming a part of a delay circuit inversely proportional to the value of an external power.

In accordance with one aspect of the present invention, there is provided a semiconductor integrated circuit device fabricated on a single semiconductor substrate, comprising: a) a first component unit powered with a first power voltage substantially constant in value, and consuming a first time period for producing a first output signal; b) a second component unit powered with a second power voltage different in value from the first power voltage, and consuming a second time period variable with the value of the second power voltage for producing a second output signal; and c) a delay circuit introducing a delay for decreasing a difference between the first time period and the second time period, and having a plurality of complementary inverters coupled in cascade and each implemented by a series combination of a p-channel enhancement type field effect transistor and an n-channel enhancement type field effect transistor, the plurality of complementary inverters including at least one complementary inverter having the p-channel enhancement type field effect transistor with a source node connected to a source of the first power voltage and with a channel region connected to a source of the second power voltage level so that a switching speed of the at least one complementary inverter is inversely proportional to the values of the second power voltage.

In accordance with another aspect of the present invention, there is provided a semiconductor memory device fabricated on a single semiconductor chip, comprising: a) a step-down voltage generator for producing an internal step-down power voltage from an external power voltage; b) a memory cell array powered with the internal step-down power voltage, and having a plurality of addressable memory cells for storing pieces of data information, one of the pieces of data information being read out from the memory cell array through a read-out sequence for producing a read-out data signal; c) a timing control circuit powered with the external power voltage for producing an internal control signal; d) an output data buffer circuit responsive to the internal control signal for producing an output data signal from the read-out data signal; and e) a delay circuit connected between the timing control circuit and the output data buffer circuit for introducing a delay into propagation of the internal control signal, and implemented by a plurality of complementary inverters coupled in cascade, the plurality of complementary inverters including at least one complementary inverter being implemented by a series combination of a p-channel type field effect transistor and an n-channel type field effect transistor connected between a source of the internal step-down power voltage and a constant voltage source, a channel region(s) of the p-channel type field effect transistor being biased with the external power voltage so that a switching speed of the at least one complementary inverter is inversely proportional to the level of the external power voltage.

BRIEF DESCRIPTION OF THE DRAWINGS

The features and advantages of the semiconductor integrated circuit device according to the present invention will be more clearly understood from the following description taken in conjunction with the accompanying drawings in which.

DESCRIPTION OF THE PREFERRED EMBODIMENTS

First Embodiment

Figure 7:
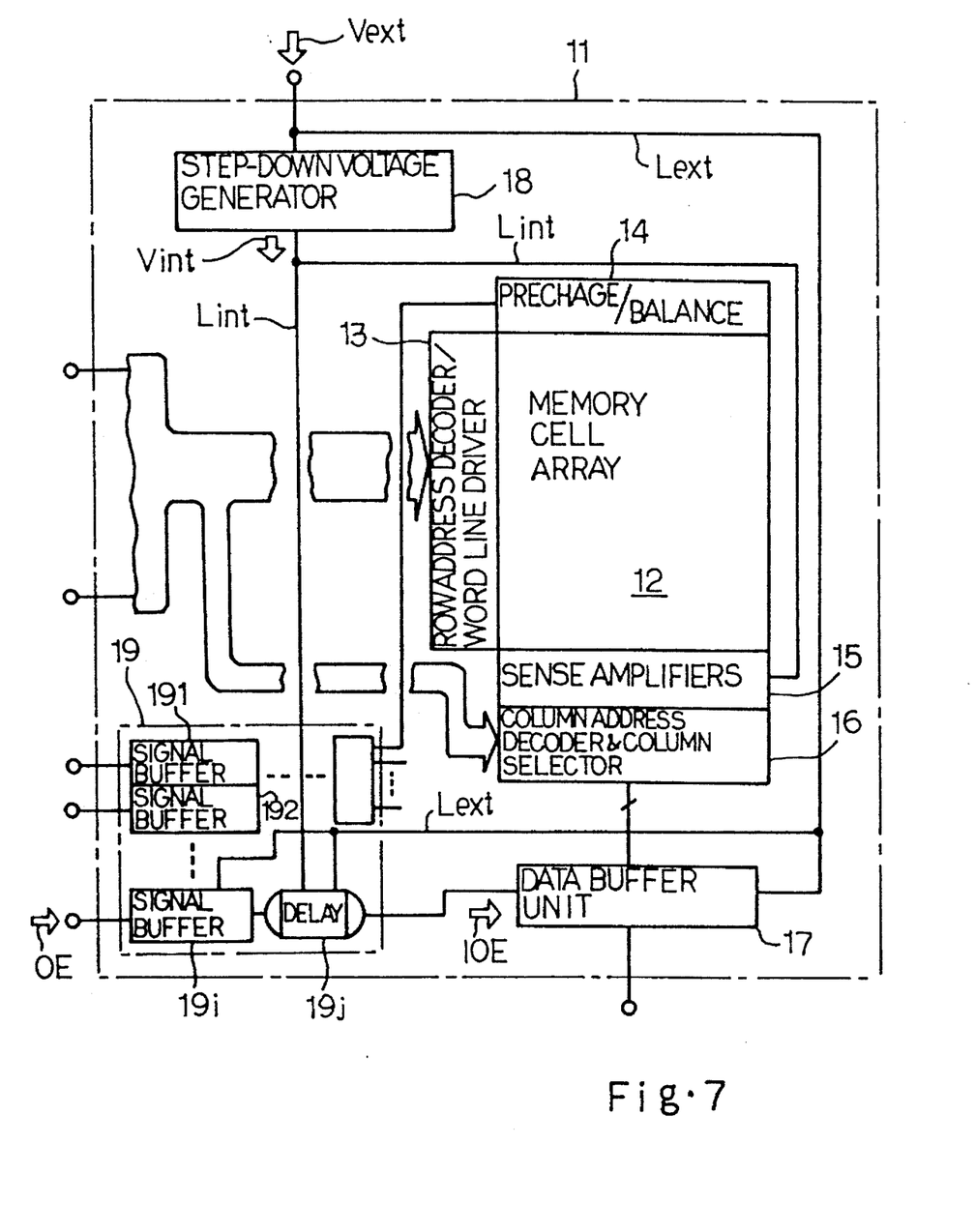
FIG. 7 is a block diagram showing the arrangement of a semiconductor memory device according to the present invention.

Referring to FIG. 7 of the present invention, a dynamic random access memory device embodying the present invention is fabricated on a p-type semiconductor substrate 11, and comprises a memory cell array 12 accompanied with a row address decoder/word line driver unit 13, a precharging/balancing unit 14, an array of sense amplifiers 15 and a column address decoder/column selector unit 16. The row address decoder/word line driver unit 13 and the column address decoder/column selector unit 16 make the memory cells of the array 12 selectively accessible. The precharging/balancing unit 14 charges and balances bit line pairs (not shown) selectively coupled with the memory cells at an intermediate voltage level, and selected memory cells produce small potential differences on the bit line pairs. The sense amplifiers 15 develop the small potential differences on the bit line pairs, and one of the bit lines is connected through the column selector with a data buffer unit 17.

The dynamic random access memory device according to the present invention further comprises a step-down voltage generator 18, and the step-down voltage generator 18 produces an internal step-down power voltage Vint from an external power voltage Vext.

The sense amplifiers 15 is powered with the internal step-down power voltage Vint, and separate the potential differences on the bit line pairs between the internal step-down power voltage level and a ground voltage level. The sense amplification consumes most of the time period from an address transition to the selection of bit line pairs.

The memory cell array, the precharging/balancing unit 14 and the sense amplifiers 15 as a whole constitute a first component unit, and the data buffer unit 17 serves as a third component unit.

The semiconductor memory device according to the present invention further comprises a timing generating unit 19, and a plurality of signal buffer circuits 191, 192, ... and 19i are incorporated in the timing generating unit 19. The signal buffer circuits 191 to 19i are coupled with signal pins for storing external control signals. The signal buffer circuit 19i is assigned to an external output enable signal OE, and supplies an internal output enable signal IOE through a delay circuit 19j to the data buffer unit 17. In this instance, the signal buffer circuit 19j serves as a second component unit.

Figure 8:
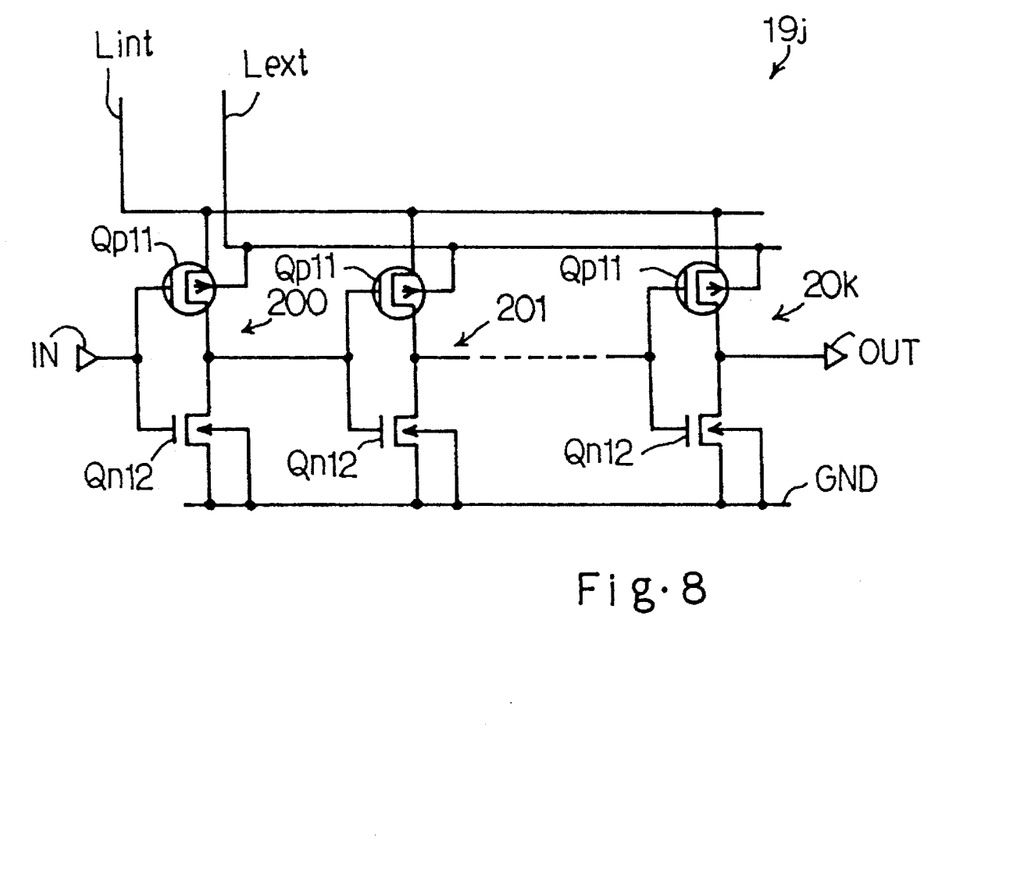
FIG. 8 is a circuit diagram showing a delay circuit incorporated in the semiconductor memory device according to the present invention.

The delay circuit 19j is implemented by a plurality of complementary inverters 200, 201, ... and 20k as shown in FIG. 8, and the complementary inverters 200 to 20k are coupled in cascade between an input node IN and an output node OUT. Each of the complementary inverters 200 to 20k is a series combination of a p-channel enhancement type switching transistor Qp11 and an n-channel enhancement type switching transistor Qn12 coupled between a step-down power supply line Lint and a ground voltage line GND. The step-down power supply line Lint distributes the internal power voltage Vint to the delay circuit 19j as well as the sense amplifiers 15.

Figure 9:
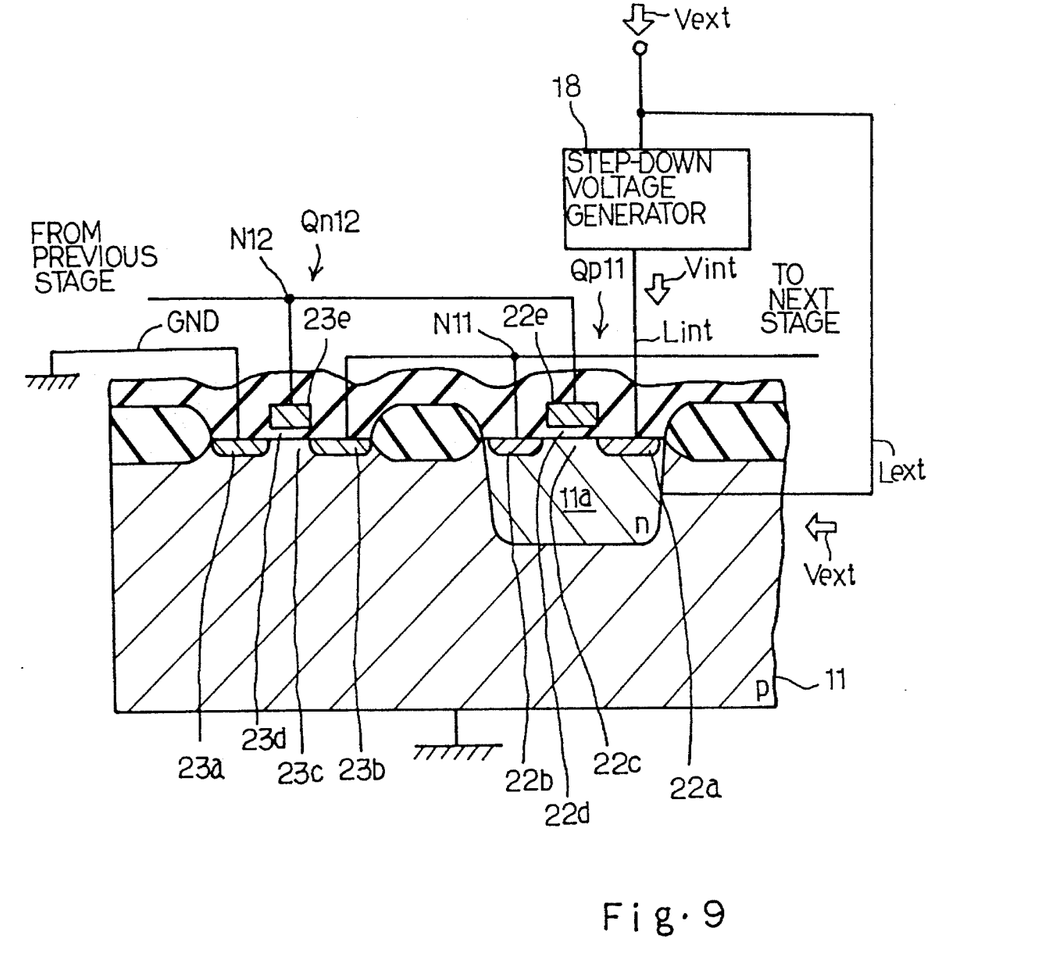
FIG. 9 is a cross sectional view showing the structure of a complementary inverter forming a part of the delay circuit according to the present invention.

As shown in FIG. 9, each p-channel enhancement type switching transistor Qp11 is assigned to an n-type well 11a defined in a surface portion of the p-type semiconductor substrate 11, and comprises a p-type source region 22a formed in the n-type well 11a, a p-type drain region 22b also formed in the n-type well 11a, a channel region 22c between the p-type source region 22a and the p-type drain region 22b, a gate insulating film 22d on the channel region 22c and a gate electrode 22e provided on the gate insulating film 22d. The p-type source region 22a is connected with the step-down power supply line Lint, and the n-type well 11a and, accordingly the channel region 22c are connected with a non-step-down power supply line Lext for the external power voltage Vext. The p-type drain region 22b is connected with an output node N11 of the complementary inverter, and the gate electrode 22e is connected with an input node N12 of the previous stage.

The n-channel enhancement type switching transistor Qn12 is assigned to a surface portion of the p-type semiconductor substrate 11, and comprises an n-type source region 23a formed in the surface portion, an n-type drain region 23b also formed in the surface portion, a channel region 23c between the p-type source region 23a and the n-type drain region 23b, a gate insulating film 23d over the channel region 23d and a gate electrode 23e on the gate insulating film 23d. The n-type source region 23a is connected with the ground voltage line GND, and the p-type semiconductor substrate 11 and, accordingly, the channel region 23c are biased with the ground voltage level. The n-type drain region 23b is connected with the output node N11, and the output node N11 is connected with the input node of the next stage. The gate electrode 23e is connected with the input node N12, and the input node N12 is connected with the output node of the previous stage.

The external power voltage Vext thus biasing the channel region 22c changes the threshold level Vtp of the p-channel enhancement type switching transistors Qp11 due to the back-gate biasing effect, and the threshold level Vtp under the back-gate biasing effect is given by Equation $$Vtp = Vtp0 - c\sqrt{V_B} \qquad \text{Equation 1}$$

where Vtp0 is the threshold level without any back-gate biasing effect, c is a constant determined by the surface state of the n-type well 11a and $V_B$ is the bias voltage of the n-type well 11a with respect to the p-type source region 22a.

As described hereinbefore, the step-down power voltage Vint at the source region 22a is substantially constant, and the non-step-down power voltage Vext is variable due to fluctuation outside of the semiconductor memory device. Therefore, if the non-step-down power voltage Vext becomes higher, the absolute value of the threshold voltage Vtp is increased, and the switching action is decelerated, because the drain current Ids is decreased with the threshold level Vtp as expressed by Equations 2 and 3.

$$Ids=C[(Vgs-Vtp)\ Vds-Vds^2/2] \quad \text{Equation 2}$$

$$Ids=C(Vgs-Vtp)^2/2 \quad \text{Equation 3}$$

where C is a constant, Vgs is a differential voltage between the source and the gate electrode and Vds is a differential voltage between the source and drain nodes. Equations 2 and 3 are applicable to the non-saturated region and the saturated region.

Figure 10:
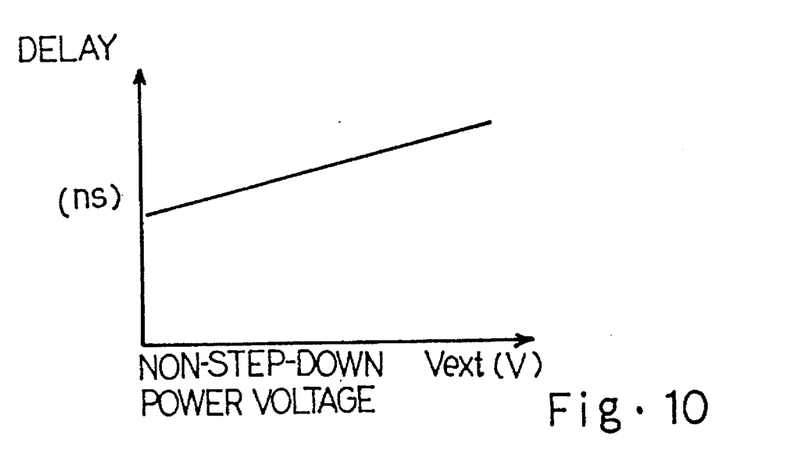
FIG. 10 is a graph showing delay introduced by the delay circuit in terms of a non-step-down power voltage.

On the other hand, if the non-step-down power voltage Vext is lowered, the absolute value of the threshold voltage Vtp is decreased, and the switching action is accelerated. As a result, the switching speed is inversely proportional to the non-step-down power voltage Vext, and, accordingly, the delay introduced by the delay circuit 19j is proportional to the non-step-down power voltage Vext as shown in FIG. 10.

Figure 11:
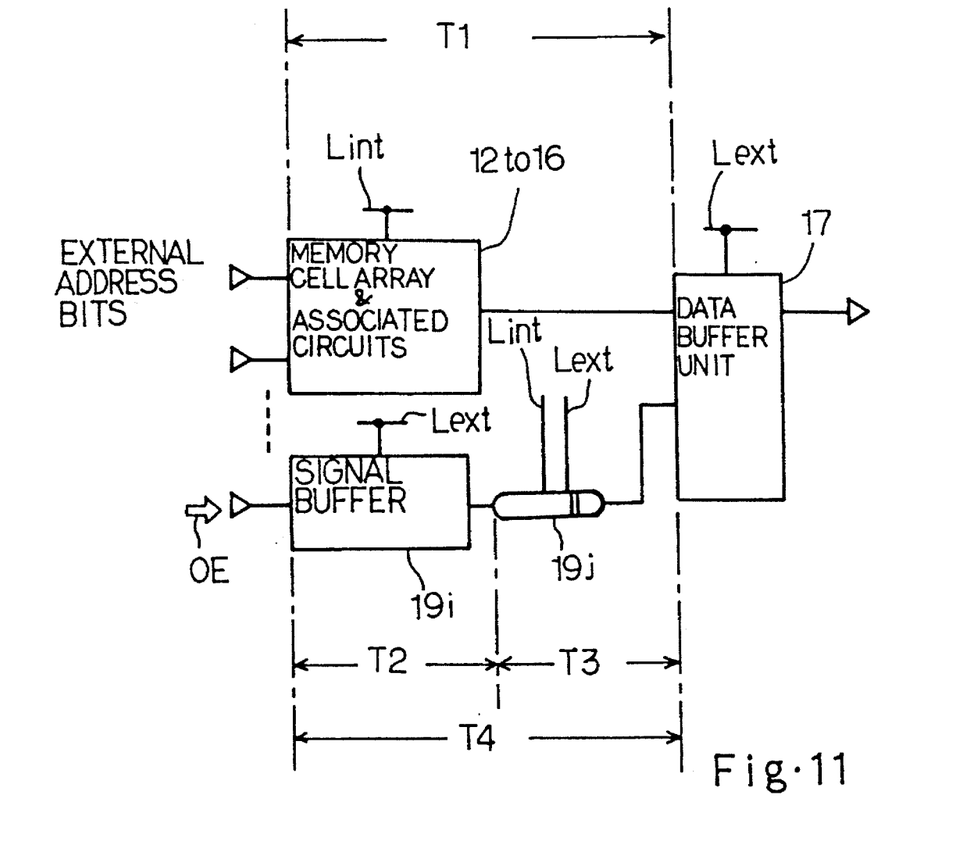
FIG. 11 is a block diagram showing relation between the delay of a read-out data signal and the delay of an internal output enable signal.

When a data bit stored in the memory cell array 12 is accessed, time T1 is consumed from the address transition to the arrival of a read-out data signal at the data buffer unit 17, and the signal buffer circuit 19i and the delay circuit 19j introduce respective delays T2 and T3 into propagation of the internal output enable signal IOE as shown in FIG. 11.

The sense amplification consumes most of the time period T1, and the time period T1 is substantially constant, because the sense amplifiers 15 are powered with the internal step-down power voltage Vint. Therefore, the time period T1 in terms of the non-step-down power voltage Vext is represented by Plots A in FIG. 12.

Figure 12:
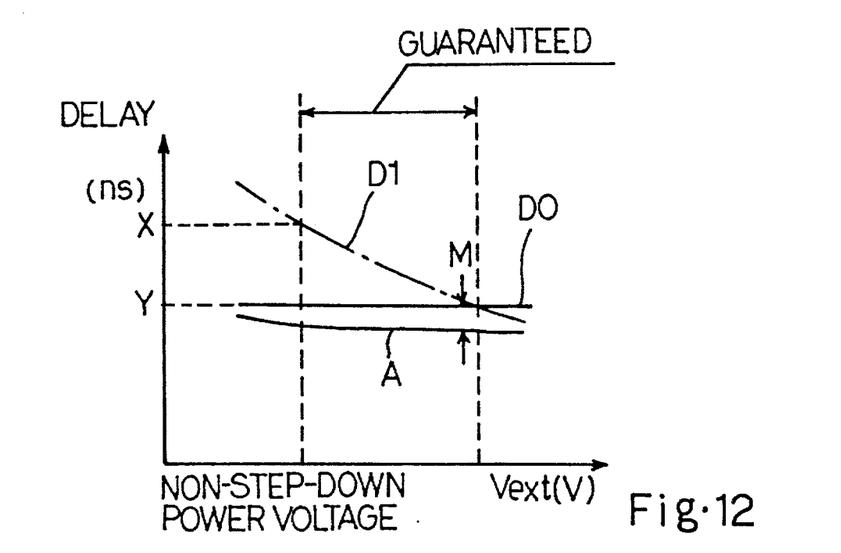
FIG. 12 is a graph showing the delays in terms of the non-step-down power voltage.

On the other hand, the time period T2 is variable together with the non-step-down power voltage Vext, because the signal buffer circuit 19i is powered with the non-step-down power voltage Vext. Namely, the switching action of the signal buffer circuit 19i is accelerated together with the non-step-down power voltage Vext, and the time period T2 is inversely proportional to the non-step-down power voltage Vext. As described hereinbefore, the time period T3 is proportional to the non-step-down power voltage Vext, and the total delay T4 is regulated to a constant value Y as indicated by Plots D0. The regulation may be carried out by changing the stages of the delay circuit 19j.

As a result, a margin M is maintained over the guaranteed range, and the manufacturer sets the guaranteed access time to Y. Comparing Plots D0 with Plots D1 of the prior art characteristic, it is understood that the semiconductor memory device according to the present invention is improved in access time.

For example, if the guaranteed range of the external power voltage Vext is from 2.5 volts to 4.0 volts and a delay circuit is expected to introduce delay of 2 nanosecond, the prior art delay circuit shown in FIG. 1 is implemented by eight complementary inverters for introducing the delay at 4.0 volts. However, the eight complementary inverters introduce 3.9 nanosecond at 2.5 volts. On the other hand, the delay circuit 19j constantly introduces the delay of 2 nanosecond over the guaranteed range, and the semiconductor memory device is improved in the access time by 1.9 nanosecond.

Second Embodiment

Figure 13:
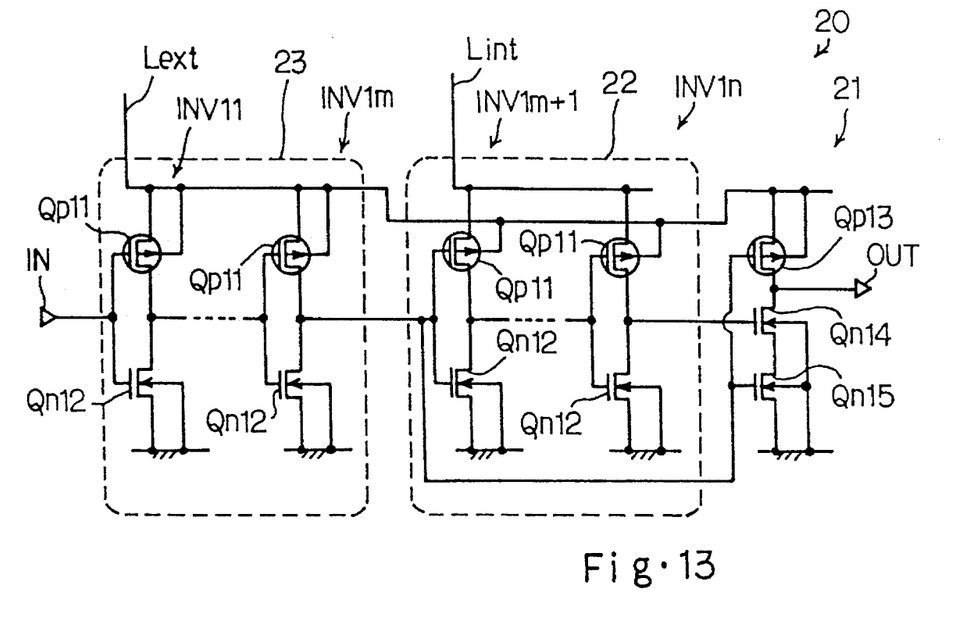
FIG. 13 is a circuit diagram showing the arrangement of another delay circuit according to the present invention.

Turning to FIG. 13 of the drawings, another delay circuit 20 embodying the present invention comprises a plurality of complementary inverters INV11 to INV1m and INV1m +1 to INV1n and a level-shift circuit 21, and the complementary inverters INV1m +1 to INV1n and the complementary inverters INV11 to INV1m form a first group 22 and a second group 23, respectively.

Each of the complementary inverters INV1 to INVn is implemented by a series combination of a p-channel enhancement type switching transistor Qp11 and an n-channel enhancement type switching transistor Qn12. The complementary inverters INV1m +1 to INV1n of the first group 22 are similarly arranged to the complementary inverter shown in FIG. 9, and the source nodes and the channel regions of the p-channel enhancement type switching transistors Qp11 of the first group 22 are biased with the step-down power voltage Vint and the non-step-down power voltage Vext, respectively. Therefore, delay introduced by the first group 22 is proportional to the non-step-down power voltage level Vext as indicated by Plots D11 in FIG. 14.

Figure 14:
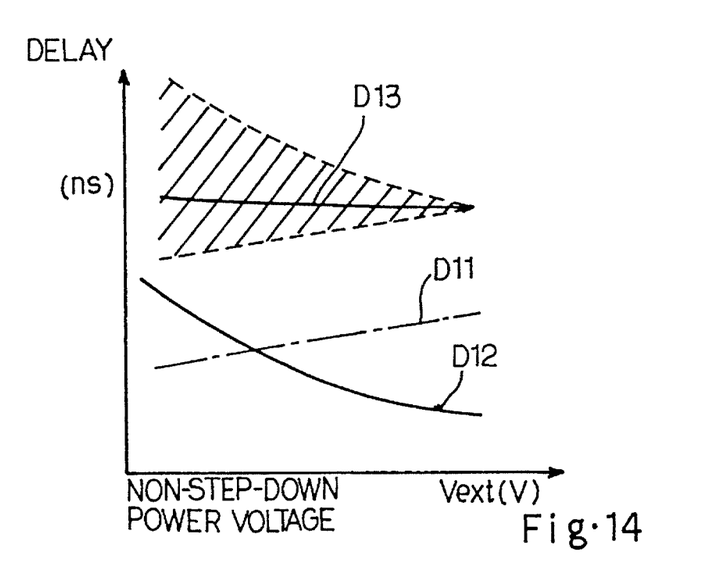
FIG. 14 is a graph showing delays introduced by the delay circuit in terms of the non-step-down power voltage.

On the other hand, the source nodes and the channel regions of the p-channel enhancement type switching transistors Qp11 of the second group 23 are biased with the non-step-down power voltage Vext, and delay introduced by the second group 23 is inversely proportional to the non-step-down power voltage Vext as indicated by Plots D12 in FIG. 14. If the number of stages of the group 22 or 23 is appropriately regulated, the total delay is substantially constant as indicated by Plots D13 in FIG. 14. The total delay is variable within a range indicated by hatched lines in FIG. 14 by changing the stages of the first or second group 22 or 23.

The level-shift circuit 21 comprises a p-channel enhancement type switching transistor Qp13 and n-channel enhancement type switching transistors Qn14 and Qn15 coupled in series between the non-step-down power voltage line Lext and the ground voltage line. The p-channel enhancement type switching transistor Qp13 and the n-channel enhancement type switching transistor Qn15 are gated by the complementary inverter INV1m, and the n-channel enhancement type switching transistor Qn14 is gated by the complementary inverter INVn. The voltage level at the output node OUT is complementarily changed to the voltage level at the input node IN, and is shifted from the voltage level at the input node IN.

If the delay circuit 20 is incorporated in the dynamic random access memory device shown in FIG. 7 instead of the delay circuit 19j, the total delay introduced by the delay circuit 20 is exactly controlled rather than that of the delay circuit 19j. This is because of the fact that the inverters incorporated in the signal buffer circuit 19i are much fewer than those of the delay circuit. Since the delay circuit 20 exactly keeps the total delay constant over the guaranteed range, the margin M can be minimized, and the guaranteed access time is further improved.

Third Embodiment

Figure 15:
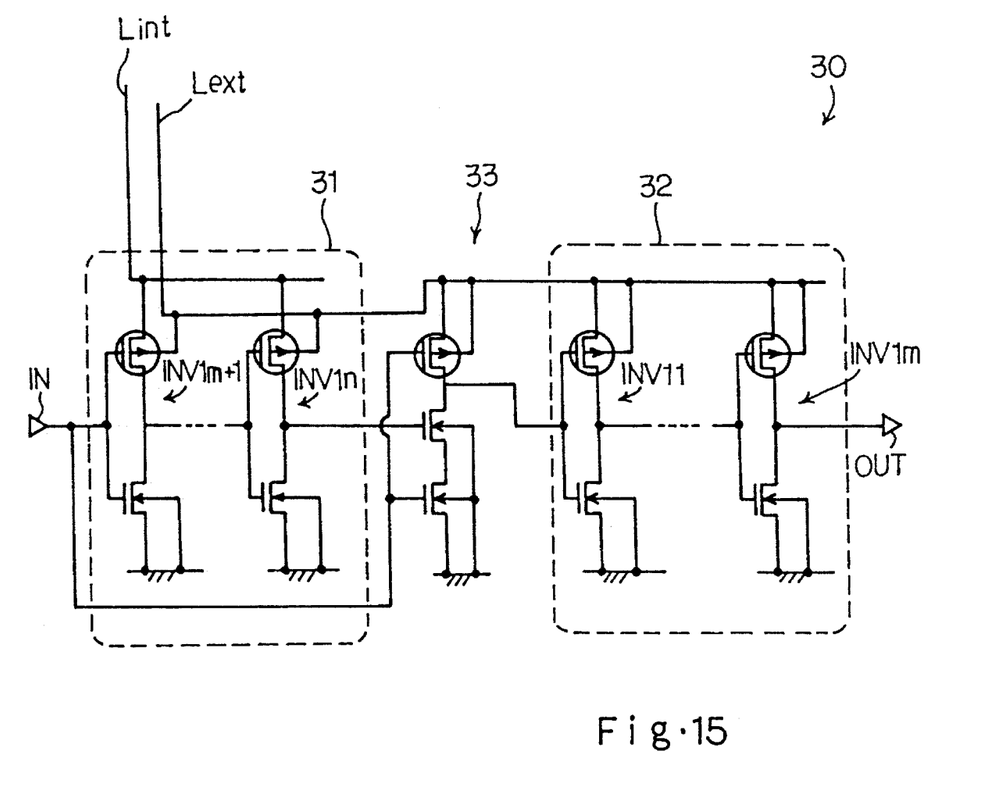
FIG. 15 is a circuit diagram showing the arrangement of yet another delay circuit according to the present invention.

Turning to FIG. 15 of the drawings, yet another delay circuit 30 embodying the present invention largely comprises a first group 31 of complementary inverters, a second group 32 of complementary inverters and a level-shift circuit 33. The first group 31 and the second group 32 are corresponding to the first group 22 and the second group 23, respectively, and the level-shift circuit 33 is coupled between the first group 31 and the second group 32.

The delay circuit 30 thus arranged achieves all the advantages of the second embodiment.

Although particular embodiments of the present invention have been shown and described, it will be obvious to those skilled in the art that various changes and modifications may be made without departing from the spirit and scope of the present invention. For example, the delay circuit according to the present invention is available for any signal path expected to regulate delay to a constant value regardless of power voltage. Moreover, an internal output enable signal may be produced from another internal control signal.

What is claimed is:

1. A semiconductor integrated circuit device fabricated on a single semiconductor substrate, comprising:
   a) a first component unit powered with a first power voltage substantially constant in value, and consuming a first time period for producing a first output signal;
   b) a second component unit powered with a second power voltage different in value from said first power voltage, and consuming a second time period variable with the value of said second power voltage for producing a second output signal; and
   c) a delay circuit introducing a delay for decreasing a difference between said first time period and said second time period, and having a plurality of complementary inverters coupled in cascade and each implemented by a series combination of a p-channel type field effect transistor and an n-channel type field effect transistor, said plurality of complementary inverters including at least one complementary inverter having the p-channel type field effect transistor with a source node connected to a source of said first power voltage and with a channel region connected to a source of said second power voltage so that a switching speed of said at least one complementary inverter is inversely proportional to the values of said second power voltage.

2. The semiconductor integrated circuit device as set forth in claim 1, in which said first power voltage is lower than said second power voltage.

3. The semiconductor integrated circuit device as set forth in claim 1, in which the others of said plurality of complementary inverters comprise respective p-channel type field effect transistors each having a source node connected to said source of said first power voltage and with a channel region connected to said source of said second power voltage.

4. A semiconductor integrated circuit device fabricated on a single semiconductor substrate, comprising:
   a) a first component unit powered with a first power voltage substantially constant in value, and consuming a first time period for producing a first output signal;
   b) a second component unit powered with a second power voltage different in value from said first power voltage, and consuming a second time period variable with the value of said second power voltage for producing a second output signal; and
   c) a delay circuit introducing a delay for decreasing a difference between said first time period and said second time period, and having a plurality of complementary inverters coupled in cascade and each implemented by a series combination of a p-channel type field effect transistor and an n-channel type field effect transistor, said plurality of complementary inverters including at least one complementary inverter having the p-channel type field effect transistor with a source node connected to a source of said first power voltage and with a channel region connected to a source of said second power voltage so that a switching speed of said at least one complementary inverter is inversely proportional to the value of said second power voltage, the others of said plurality of complementary inverters being divided into a first and a second group, each of the complementary inverters of said first group having a source node connected to said source of said first power voltage and with a channel region connected to said source of said second power voltage, each of said complementary inverters of said second group having a source node and a channel region both connected to said source of said second power voltage.

5. The semiconductor integrated circuit device as set forth in claim 4, in which further comprising a level-shifter for transferring said second output signal from one of said plurality of complementary inverters serving as the final stage of said delay circuit to a third component circuit.

6. The semiconductor integrated circuit device as set forth in claim 4, in which further comprising a level-shifter connected between said first group and said second group.

7. A semiconductor memory device fabricated on a single semiconductor chip, comprising:
   a) a step-down voltage generator for producing an internal step-down power voltage from an external power voltage;
   b) a memory cell array powered with said internal step-down power voltage, and having a plurality of addressable memory cells for storing pieces of data information, one of said pieces of data information being read out from said memory cell array through a read-out sequence for producing a read-out data signal;
   c) a timing control circuit powered with said external power voltage for producing an internal control signal;
   d) an output data buffer circuit responsive to said internal control signal for producing an output data signal from said read-out data signal; and
   e) a delay circuit connected between said timing control circuit and said output data buffer circuit for introducing a delay into propagation of said internal control signal, and implemented by a plurality of complementary inverters coupled in cascade, said plurality of complementary inverters including at least one complementary inverter being implemented by a series combination of a p-channel type field effect transistor and an n-channel type field effect transistor connected between a source of said internal step-down power voltage and a constant voltage source, a channel regions of said p-channel type field effect transistor being biased with said external power voltage so that a switching speed of said at least one complementary inverter is inversely proportional to the level of said external power voltage.

* * * * *

UNITED STATES PATENT AND TRADEMARK OFFICE
CERTIFICATE OF CORRECTION

PATENT NO.   : 5,461,585
DATED        : October 24, 1995
INVENTOR(S)  : Toru CHONAN It is certified that error(s) appears in the above-identified patent and that said Letters Patent is hereby corrected as shown below:

Col. 1, line 28, delete "Qp1" and insert --Qn1--.

Col. 6, line 36, delete "p-type" and insert --n-type--.

Col. 6, line 38, delete "23d" and insert --23c--.

Signed and Sealed this

Thirtieth Day of April, 1996

Attest:

BRUCE LEHMAN

*Attesting Officer*  *Commissioner of Patents and Trademarks*